US012096570B2

(12) United States Patent
Tominaga et al.

(10) Patent No.: US 12,096,570 B2
(45) Date of Patent: Sep. 17, 2024

(54) WIRING FORMATION METHOD

(71) Applicant: FUJI CORPORATION, Chiryu (JP)

(72) Inventors: Ryojiro Tominaga, Okazaki (JP); Yoshitaka Hashimoto, Kariya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/904,502

(22) PCT Filed: Mar. 2, 2020

(86) PCT No.: PCT/JP2020/008620
§ 371 (c)(1),
(2) Date: Aug. 18, 2022

(87) PCT Pub. No.: WO2021/176498
PCT Pub. Date: Sep. 10, 2021

(65) Prior Publication Data

US 2023/0112913 A1 Apr. 13, 2023

(51) Int. Cl.
*H05K 3/46* (2006.01)
*H05K 3/12* (2006.01)
*H05K 3/32* (2006.01)

(52) U.S. Cl.
CPC .......... *H05K 3/4664* (2013.01); *H05K 3/125* (2013.01); *H05K 3/1291* (2013.01); *H05K 3/32* (2013.01)

(58) Field of Classification Search
CPC .... H05K 3/4664; H05K 3/125; H05K 3/1291; H05K 3/32
See application file for complete search history.

(56) References Cited

U.S. PATENT DOCUMENTS 6,692,995 B2 * 2/2004 Gavish .............. H01L 21/76898 257/E23.179
7,056,180 B2 * 6/2006 Morii ..................... H10K 50/82 445/35

(Continued)

FOREIGN PATENT DOCUMENTS

CN 107006120 A * 8/2017 ............. H05K 1/028
JP 2004055965 A * 2/2004 ......... H01L 21/4857

(Continued)

OTHER PUBLICATIONS

International Search Report Issued May 26, 2020, in PCT/JP2020/008620, filed on Mar. 2, 2020, 2 pages.

*Primary Examiner* — Jeffrey T Carley
(74) *Attorney, Agent, or Firm* — Oblon, McClelland, Maier & Neustadt, L.L.P.

(57) ABSTRACT

To provide a wiring formation method that can increase the wiring density in a case where wiring is formed on an inclined surface by three-dimensional additive manufacturing. The wiring formation method of the present disclosure includes a metal member forming step of forming multiple metal members with a first fluid containing metal particles, a resin layer forming step of forming a resin layer including an upper surface and an inclined surface inclined downward from the upper surface, and a connection wiring forming step of forming multiple connection wirings on the inclined surface and the upper surface of the resin layer with a second fluid containing metal particles, and the connection wirings being formed to individually connect the multiple connection wirings to the multiple metal members on a lower surface of the inclined surface.

12 Claims, 8 Drawing Sheets

163 165 167 159 155A 157 161 155 153 153A 153 151 150 70

151 151 151 P1 157 LOWER LAYER 155A 155 155B UPPER LAYER 159 159 159

(56) References Cited

U.S. PATENT DOCUMENTS 7,842,947 B2 * 11/2010 Nakatani .............. H10K 71/135 438/34
8,130,177 B2 * 3/2012 Nakatani ................ H10K 71/12 313/506
8,373,170 B2 * 2/2013 Murakami ........... H10K 59/122 313/500
2005/0200273 A1 * 9/2005 Nozawa ................. H10K 50/82 313/506
2006/0040489 A1 * 2/2006 Shintate ............... H05K 3/4664 438/618
2006/0115983 A1 * 6/2006 Fujii ................. H01L 21/76879 257/E21.174
2006/0164468 A1 * 7/2006 Yoda .................... B41J 2/14233 347/71
2007/0264814 A1 * 11/2007 Hirai ..................... H01L 27/124 438/617
2007/0290306 A1 * 12/2007 Muramatsu ............ H05K 1/111 438/106
2008/0311285 A1 * 12/2008 Hirai .................... H05K 3/4664 427/97.2
2009/0078746 A1 * 3/2009 Karashima ........... H05K 3/3485 228/248.1
2010/0123248 A1 * 5/2010 Yajima ..................... H05K 3/32 438/677
2013/0069087 A1 * 3/2013 Onodera .............. H05K 3/4664 257/88
2017/0020001 A1 1/2017 Weidinger
2017/0020006 A1 1/2017 Kumaki et al.

FOREIGN PATENT DOCUMENTS

JP 2008-60452 A 3/2008
JP 2013-65687 A 4/2013
JP 2019145599 A * 8/2019
WO WO-9919900 A2 * 4/1999 ............. B33Y 10/00
WO WO 2015/136900 A1 9/2015
WO WO 2016-189577 A1 12/2016
WO WO-2017169421 A1 * 10/2017 ............... H05K 1/09
WO WO 2018/142577 A1 8/2018

* cited by examiner

WIRING FORMATION METHOD

TECHNICAL FIELD

The present disclosure relates to a wiring formation method of forming wiring by a fluid containing metal particles by three-dimensional additive manufacturing.

BACKGROUND ART

In recent years, as described in Patent Literature 1, a technique that forms a circuit for connecting electronic components or the like by discharging a fluid containing metal particles and firing the discharged fluid has been developed. In a wiring formation method of Patent Literature 1, the first wiring is formed by a fluid containing metal particles, and a resin layer is formed by an ultraviolet curable resin on the first wiring. A via hole is formed in the resin layer. An inner wall of the via hole is inclined, and a lower end of an inclined surface is continuous with an upper surface of the first wiring. Second wiring connected to the first wiring through the inclined surface of the via hole is formed on the resin layer.

PATENT LITERATURE

Patent Literature 1: International Publication No. WO2016-189557

BRIEF SUMMARY

Technical Problem

According to the technique described in Patent Literature 1 described above, the first wiring disposed below the resin layer and the second wiring disposed on the upper surface of the resin layer can be connected to each other by wiring formed on the inclined surface of the via hole by three-dimensional additive manufacturing. Here, for example, in a case where the fluid containing metal particles is discharged on the inclined surface of the via hole by an ink jet method when an angle of the inclined surface is steep, the discharged fluid may flow down along the inclined surface. Therefore, in order to suppress the fluid containing the metal particles from flowing down, it is necessary to reduce the angle of the inclined surface to a certain angle or less. However, as the angle of the inclined surface is reduced, there is a problem that an opening of the via hole is widened, an occupied area of the via hole on the board is increased, and the wiring density is reduced.

The present disclosure has been made in view of the above circumstances, and an object thereof is to provide a wiring formation method that can increase the wiring density in a case where wiring is formed on an inclined surface by three-dimensional additive manufacturing.

Solution to Problem

In order to solve the above problems, the present disclosure discloses a wiring formation method including a metal member forming step of forming multiple metal members with a first fluid containing metal particles, a resin layer forming step of forming a resin layer including an upper surface and an inclined surface inclined downward from the upper surface, and a connection wiring forming step of forming multiple connection wirings on the inclined surface and the upper surface of the resin layer with a second fluid containing metal particles, and the connection wirings being formed to individually connect each of the multiple connection wirings to each of the multiple metal members on a lower side of the inclined surface.

Advantageous Effects

According to the wiring formation method of the present disclosure, the multiple metal members and the multiple connection wirings are connected to each other through one inclined surface formed on the resin layer. As a result, even when the angle of the inclined surface is reduced in order to suppress the flow-down of the second fluid containing the metal particles and an occupied area of the inclined surface is increased, the wiring density can be increased by forming multiple sets of combinations of the metal member and the connection wiring on one inclined surface. The pitch between the connection wirings can be significantly narrowed, and the wiring density can be significantly increased as compared with the case where the connection wirings are formed one by one on the multiple inclined surfaces. As a result, it is possible to downsize a shaped object such as a board.

DESCRIPTION OF EMBODIMENTS (Configuration of Electronic Device Manufacturing Apparatus)

Figure 1:
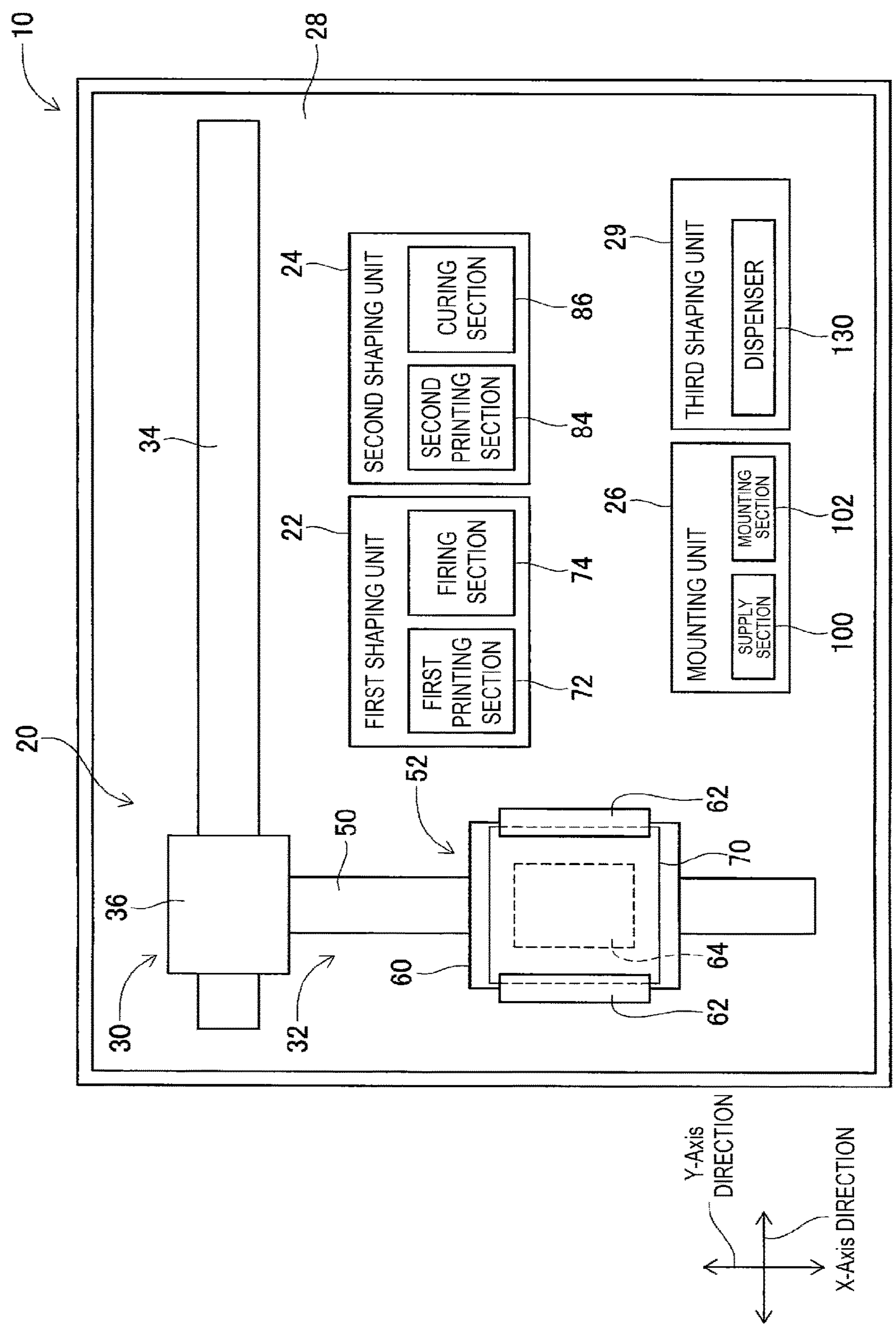
FIG. 1 is a diagram illustrating an electronic device manufacturing apparatus.

Hereinafter, preferred embodiments of the present disclosure will be described in detail with reference to the drawings. FIG. 1 illustrates electronic device manufacturing apparatus 10. Electronic device manufacturing apparatus 10 is provided with conveyance device 20, first shaping unit 22, second shaping unit 24, mounting unit 26, third shaping unit 29, and control device 27 (refer to FIGS. 2 and 3). Conveyance device 20, first shaping unit 22, second shaping unit 24, mounting unit 26, and third shaping unit 29 are disposed on base 28 of electronic device manufacturing apparatus 10. Base 28 has normally rectangular in a plan view. In the following description, a longitudinal direction of base 28 will be referred to as an X-axis direction, a shorter direction of base 28 will be referred to as a Y-axis direction, and a direction orthogonal to both the X-axis direction and the Y-axis direction will be referred to as a Z-axis direction.

Conveyance device 20 is provided with X-axis slide mechanism 30 and Y-axis slide mechanism 32. X-axis slide mechanism 30 includes X-axis slide rail 34 and X-axis slider 36. X-axis slide rail 34 is disposed to extend in the X-axis direction on base 28. X-axis slider 36 is held by X-axis slide rail 34 to be slidable in the X-axis direction. Furthermore, X-axis slide mechanism 30 includes electromagnetic motor 38 (refer to FIG. 2) and moves X-axis slider 36 to any position in the X-axis direction by driving electromagnetic motor 38. In addition, Y-axis slide mechanism 32 includes Y-axis slide rail 50 and stage 52. Y-axis slide rail 50 is disposed to extend in the Y-axis direction on base 28. One end portion of Y-axis slide rail 50 is connected to X-axis slider 36. Therefore, Y-axis slide rail 50 is movable in the X-axis direction. Stage 52 is held by Y-axis slide rail 50 so as to be slidable in the Y-axis direction. Y-axis slide mechanism 32 includes electromagnetic motor 56 (refer to FIG. 2) and moves stage 52 to any position in the Y-axis direction by driving electromagnetic motor 56. As a result, by driving X-axis slide mechanism 30 and Y-axis slide mechanism 32, stage 52 is moved to any position on base 28.

Stage 52 includes base plate 60, holding device 62, and lifting and lowering device 64. Base plate 60 is formed in a flat plate shape, and base material 70 is placed on an upper surface thereof. Holding device 62 is provided on both side portions of base plate 60 in the X-axis direction. Holding device 62 fixedly holds base material 70 with respect to base plate 60 by interposing both edge portions in the X-axis direction of base material 70 placed on base plate 60. In addition, lifting and lowering device 64 is disposed below base plate 60, and lifts and lowers base plate 60 in the Z-axis direction.

First shaping unit 22 is a unit for shaping wiring on base material 70 placed on base plate 60 of stage 52, and includes first printing section 72 and firing section 74. First printing section 72 has ink jet head 76 (refer to FIG. 2) and linearly discharges conductive ink on base material 70 placed on base plate 60. The conductive ink is an example of a fluid containing metal nanoparticles of the present disclosure. The conductive ink includes, for example, fine particles of metal (such as silver) having a nanometer size as the main component dispersed in a solvent, and is cured by firing with heat. The conductive ink includes, for example, metal nanoparticles having a size of several hundred nanometers or less. The surface of the metal nanoparticle is coated with, for example, a dispersant to prevent aggregation in the solvent.

Ink jet head 76 discharges conductive ink from multiple nozzles, for example, by a piezo method using piezoelectric elements. In addition, the device for discharging conductive ink (fluid containing metal nanoparticles) is not limited to an ink jet head including multiple nozzles, and may be a dispenser including one nozzle, for example. In addition, the type of metal nanoparticles included in the conductive ink is not limited to silver, and may be copper, gold, or the like. In addition, the number of types of metal nanoparticles included in the conductive ink is not limited to one type, and may be multiple types.

Figure 2:
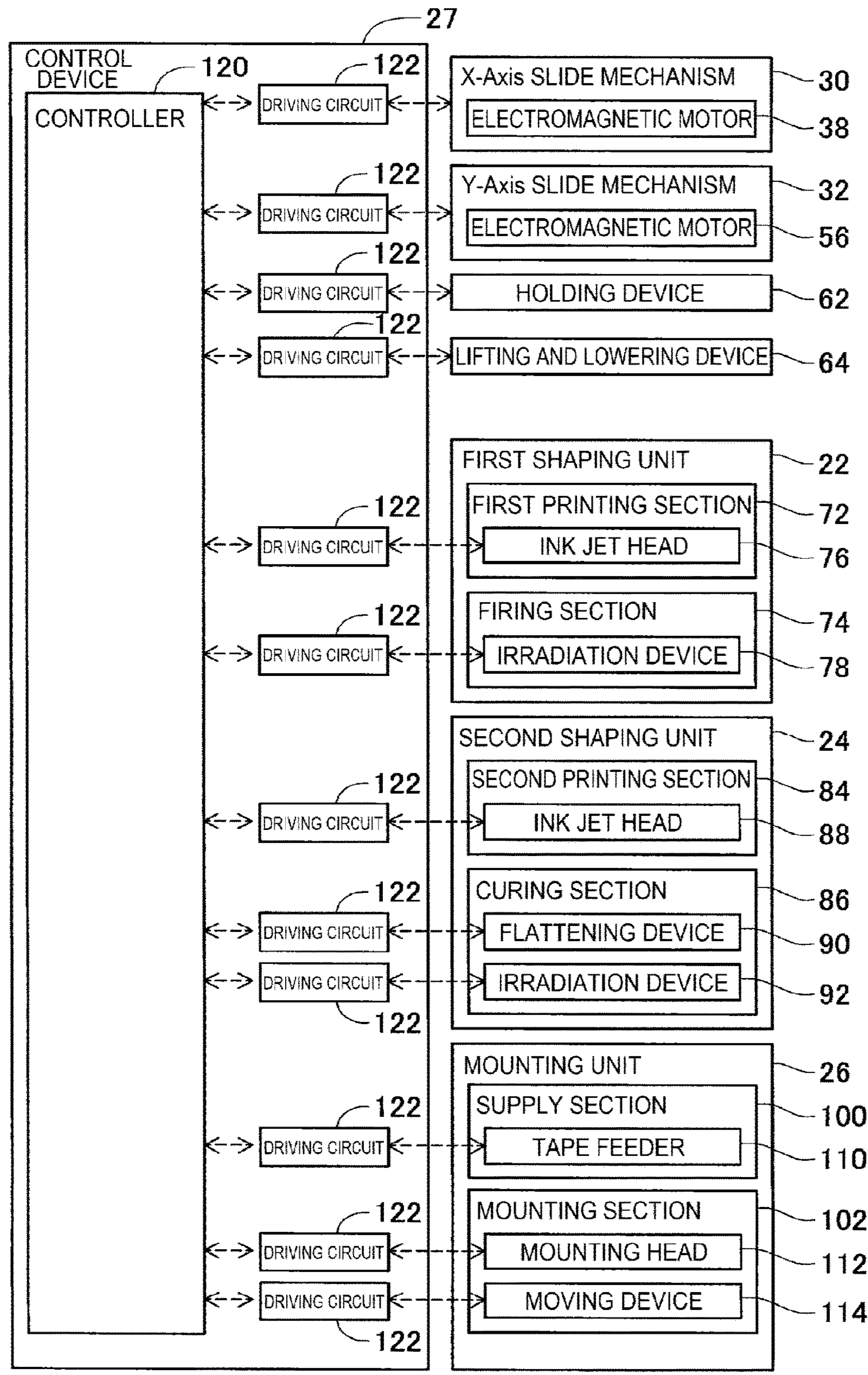
FIG. 2 is a block diagram illustrating a control device.

Firing section 74 includes irradiation device 78 (refer to FIG. 2). Irradiation device 78 is provided with, for example, an infrared heater that heats the conductive ink discharged on base material 70. The conductive ink is fired by applying heat from an infrared heater to form wiring. The firing of the conductive ink referred to herein means, for example, a phenomenon in which by applying energy, a solvent is vaporized or a protective film of the metal nanoparticles, that is, a dispersant is decomposed, and the metal nanoparticles are brought into contact with each other or fused to increase the conductivity. The wiring can be formed by firing the conductive ink. The device for heating the conductive ink is not limited to an infrared heater. For example, electronic device manufacturing apparatus 10 may be provided with an infrared lamp, a laser irradiation device that irradiates the conductive ink with laser light, or an electric furnace in which base material 70 from which the conductive ink is discharged is placed in a furnace and heated as a device for heating the conductive ink.

Second shaping unit 24 is a unit for shaping a resin layer on base material 70 placed on base plate 60, and includes second printing section 84 and curing section 86. Second printing section 84 includes ink jet head 88 (refer to FIG. 2), and discharges an ultraviolet curable resin onto base material 70 placed on base plate 60. The ultraviolet curable resin is a resin that is cured by irradiation with ultraviolet light. A method by which ink jet head 88 discharges the ultraviolet curable resin may be, for example, a piezo method using a piezoelectric element, or may be a thermal method in which the resin is heated to generate air bubbles and discharged from multiple nozzles.

Curing section 86 includes flattening device 90 (refer to FIG. 2) and irradiation device 92 (refer to FIG. 2). Flattening device 90 is a device for flattening an upper surface of the ultraviolet curable resin discharged onto base material 70 by ink jet head 88. Flattening device 90 makes the thickness of the ultraviolet curable resin uniform, for example, by scraping off excess resin by a roller or a blade while leveling the surface of the ultraviolet curable resin. In addition, irradiation device 92 is provided with a mercury lamp or LED as a light source, and irradiates the ultraviolet curable resin discharged onto base material 70 with ultraviolet light. As a result, the ultraviolet curable resin discharged on base material 70 is cured, and a resin layer can be formed.

Mounting unit 26 is a unit for mounting an electronic component on base material 70 placed on base plate 60, and includes supply section 100 and mounting section 102. Supply section 100 includes multiple tape feeders 110 (refer to FIG. 2) for feeding the taped electronic components one by one, and supplies the electronic components at each supply position. The electronic component is, for example, a sensor element such as a temperature sensor. The supply of the electronic components is not limited to the supply by tape feeder 110, and may be performed by a tray.

Mounting section 102 includes mounting head 112 (refer to FIG. 2) and moving device 114 (refer to FIG. 2). Mounting head 112 includes a suction nozzle for picking up and holding an electronic component. The suction nozzle picks up and holds the electronic component by suction of air by supplying a negative pressure from a positive and negative pressure supply device (not illustrated). The electronic component is separated by supplying a slight positive pressure from the positive and negative pressure supplying device. In addition, moving device 114 moves mounting head 112 between the supply position of tape feeder 110 and base material 70 placed on base plate 60. As a result, mounting section 102 holds the electronic component by the suction nozzle, and disposes the electronic component held by the suction nozzle on base material 70.

Third shaping unit 29 is a unit for applying a conductive paste on base material 70 placed on base plate 60. The conductive paste is an example of a fluid containing the metal microparticles of the present disclosure. The conductive paste is, for example, a viscous fluid in which micro-sized metal particles (for example, micro filler) are included in an adhesive made of a resin. The micro-sized metal microparticles are, for example, metal in a flake state (silver or the like). The metal microparticles are not limited to silver, and may be gold, copper, or the like, or multiple types of metals. The adhesive contains, for example, an epoxy resin as the main component. The conductive paste is cured by heating, and is used, for example, to form a connection terminal to be connected to the wiring. The connection terminal is, for example, a bump connected to a component terminal of an electronic component, an external electrode connected to an external device, or the like.

Third shaping unit 29 includes dispenser 130 as a device for discharging (applying) a conductive paste. The device for applying the conductive paste is not limited to the dispenser, and may be a screen printing device or a gravure printing device. In addition, the term "applying" in the present disclosure is a concept including an operation of discharging a fluid from a nozzle or the like, and an operation of adhering a fluid on a target object by screen printing or gravure printing. Dispenser 130 discharges the conductive paste on base material 70 or the resin layer. The discharged conductive paste is heated and cured by, for example, firing section 74 of first shaping unit 22 to form a connection terminal (external electrode or the like).

Here, the conductive paste includes, for example, metal microparticles having a size of several tens of micrometers or less. The adhesive (resin or the like) is cured by heating, and the conductive paste is cured in a state where the metals in a flake state are in contact with each other. As described above, the conductive ink is, for example, metal integrated by fusing the metal nanoparticles by heating, and the conductivity is increased as compared with a state where the metal nanoparticles are merely in contact with each other. On the other hand, the conductive paste is cured by bringing micro-sized metal microparticles into contact with each other by curing an adhesive. Therefore, the resistance (electrical resistivity) of the wiring formed by curing the conductive ink is significantly low, for example, several to several tens of micro Ω·cm, and is lower than the resistance (several tens to several thousands of micro Ω·cm) of the wiring in which the conductive paste is cured. Accordingly, the conductive ink is suitable for shaping a shaped object requiring a low resistance value, such as circuit wiring having a low resistance.

On the other hand, the conductive paste can improve the adhesion with another member by curing the adhesive when curing, and is excellent in the adhesion with another member as compared with the conductive ink. Another member referred to herein is a member to which a conductive paste is adhered by discharging or the like, and is, for example, a resin layer, wiring, a component terminal of an electronic component, or the like. Accordingly, the conductive paste is suitable for shaping a shaped object requiring mechanical strength (tensile strength or the like), such as a connection terminal for fixing an electronic component to a resin layer. In electronic device manufacturing apparatus 10 of the present embodiment, an electronic circuit having improved electrical properties and mechanical properties can be produced by selectively using such conductive ink and a conductive paste to utilize the characteristics.

Figure 3:
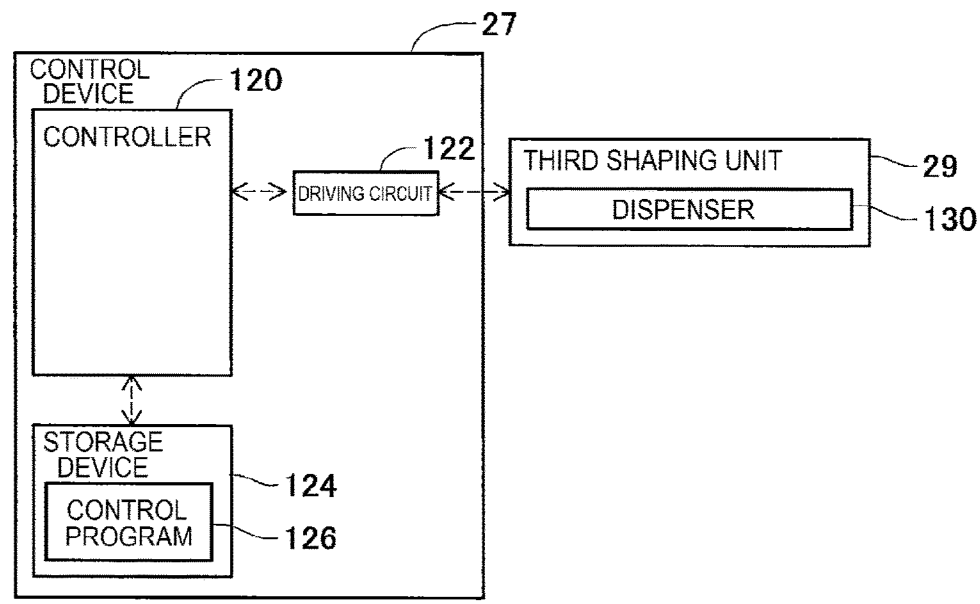

Next, a configuration of control device 27 of electronic device manufacturing apparatus 10 will be described. As illustrated in FIGS. 2 and 3, control device 27 is provided with controller 120, multiple drive circuits 122, and storage device 124. Multiple drive circuits 122 are connected to electromagnetic motors 38 and 56, holding device 62, lifting and lowering device 64, ink jet head 76, irradiation device 78, ink jet head 88, flattening device 90, irradiation device 92, tape feeder 110, mounting head 112, and moving device 114 (refer to FIG. 2). In addition, drive circuit 122 is connected to third shaping unit 29 (refer to FIG. 3).

Controller 120 is provided with CPU, ROM, RAM, and the like, is mainly a computer, and is connected to multiple drive circuits 122. Storage device 124 is provided with RAM, ROM, a hard disk, and the like, and stores control program 126 for controlling electronic device manufacturing apparatus 10. Controller 120 can control the operations of conveyance device 20, first shaping unit 22, second shaping unit 24, mounting unit 26, third shaping unit 29, and the like by executing control program 126 with CPU. In the following description, the fact that controller 120 executes control program 126 to control each device may be simply referred to as a "device". For example, the fact that "controller 120 causes stage 52 to move" means that "controller 120 executes control program 126, controls the operation of conveyance device 20 through drive circuit 122, and causes stage 52 to move by the operation of conveyance device 20".

(Operation of Electronic Device Manufacturing Apparatus)

With the above configuration, electronic device manufacturing apparatus 10 of the present embodiment manufactures an electronic device including wiring, a connection terminal, and an electronic component as a shaped object. In the following description, a case where a circuit board on which the electronic component is mounted is manufactured as an electronic device (shaped object). The structure, manufacturing procedure, and the like of the shaped object described below are examples. In addition, for example, control program 126 of storage device 124 sets three-dimensional data of each layer obtained by slicing the circuit board at the time of completion. Controller 120 controls first shaping unit 22 or the like based on the data of control program 126 to discharge, cure, or the like the ultraviolet curable resin to form a circuit board.

Figure 4:
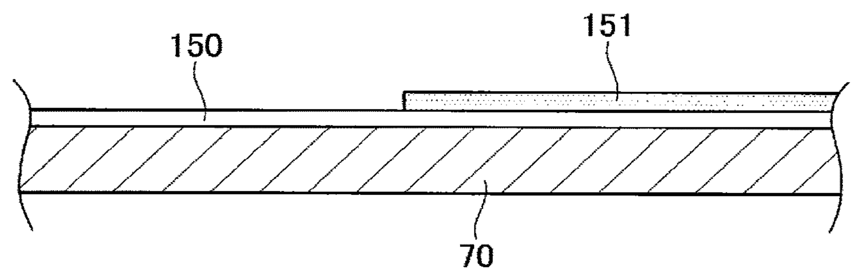
FIG. 4 is a schematic diagram for describing a step of forming wiring.

First, when base material 70 is set on base plate 60 of stage 52, controller 120 shapes the electronic device on base material 70 while causing stage 52 to move. As illustrated in FIG. 4, release film 150 that can be peeled by heat, for example, is adhered to an upper surface of base material 70, and a shaped object (electronic device or the like) is formed on release film 150. Release film 150 is peeled from base material 70 together with the shaped object by heating. A method of separating base material 70 and the shaped object is not limited to a method of using release film 150. For example, a member (support material or the like) that is melted by heat may be disposed between base material 70 and the shaped object, and may be melted and separated. In addition, the shaped object may be directly shaped on base material 70 without using a separating member such as release film 150.

When base material 70 is set, controller 120 causes stage 52 to move below first shaping unit 22. Controller 120 causes first printing section 72 to discharge the conductive ink on release film 150 by ink jet head 76. Inkjet head 76 discharges the conductive ink in a linear manner depending on a wiring pattern. The wiring pattern is set in control program 126, for example, according to the shaped object to be manufactured. FIG. 8 illustrates a state where via hole 155 of an electronic device, which is a final shaped object, is viewed in a plan view. In FIG. 8, resin layer 153 (refer to FIG. 7) and resin layer 161 (refer to FIG. 7) for filling via hole 155, which will be described later, are not illustrated. In addition, FIG. 8 illustrates wiring 151 in a lower layer with dashed lines. As illustrated in FIG. 8, controller 120 of the present embodiment connects multiple wirings 151 in a lower layer and multiple wirings 159 in an upper layer through one via hole 155. Therefore, in a manufacturing step of the wiring illustrated in FIG. 4, controller 120 causes ink jet head 76 to discharge the conductive ink to positions corresponding to multiple wirings 151.

Next, controller 120 causes firing section 74 of first shaping unit 22 to discharge the conductive ink on release film 150 to be heated by the infrared heater of irradiation device 78. As a result, by firing the conductive ink, it is possible to form wiring 151 on release film 150 as illustrated in FIG. 4. As illustrated in FIG. 8, wiring 151 is arranged side by side with predetermined pitch P1 therebetween.

Figure 5:
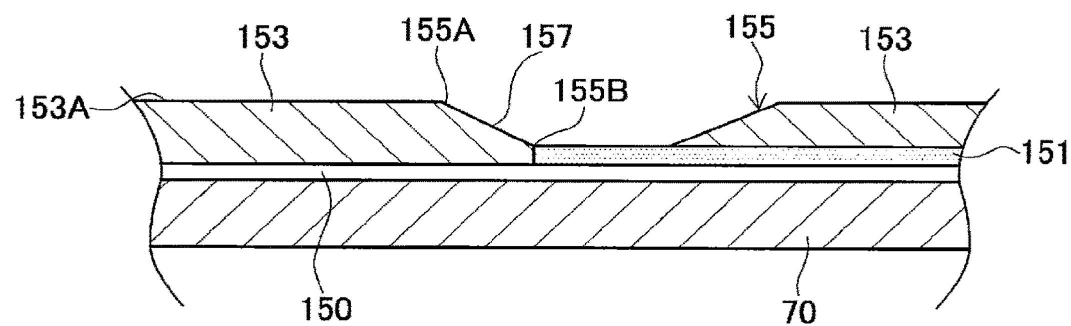
FIG. 5 is a schematic diagram for describing a step of forming wiring.

Next, as illustrated in FIG. 5, controller 120 forms resin layer 153 on release film 150 so as to cover wiring 151. When forming resin layer 153, controller 120 forms via hole 155 in which a part of each wiring 151 is exposed in resin layer 153. Controller 120 repeatedly executes a process of discharging the ultraviolet curable resin from ink jet head 88 of second shaping unit 24 and a process of irradiating the discharged ultraviolet curable resin with ultraviolet light from irradiation device 92 of curing section 86. Therefore, resin layer 153 having via hole 155 is formed.

Specifically, controller 120 causes stage 52 to move below second shaping unit 24, and causes second printing section 84 to discharge an ultraviolet curable resin from ink jet head 88 onto release film 150 in a thin film shape so as to cover wiring 151. Controller 120 causes ink jet head 88 to discharge the ultraviolet curable resin to a portion other than via hole 155 exposing a part of each wiring 151. That is, ink jet head 88 discharges the ultraviolet curable resin in a thin film shape on release film 150 so as to expose a part of each wiring 151 from via hole 155 and cover other portions of wiring 151. After discharging the ultraviolet curable resin in a thin film shape, controller 120 may execute flattening by flattening device 90 so that the film thickness is uniform. Curing section 86 irradiates the ultraviolet curable resin having a thin film shape with ultraviolet light by irradiation device 92. As a result, a resin layer having a thin film shape is formed on release film 150.

Controller 120 adjusts the discharge position of the ultraviolet curable resin so as to expose a part of wiring 151, and repeatedly executes the discharge, flattening, and irradiating with ultraviolet light of the ultraviolet curable resin as appropriate to form resin layer 153 having via hole 155. As illustrated in FIG. 5, controller 120 forms mortar-shaped via hole 155 having an inclined inner wall. Inclined surface 157 inclined so as to reduce the inner diameter is formed on the inner wall of via hole 155 from upper opening 155A on an upper side toward lower opening 155B on the lower side (on wiring 151 side). As illustrated in FIG. 8, controller 120 forms, for example, a hole having an inner diameter longer in one direction (left-right direction in FIG. 8) and having a substantially rectangular shape in a plan view as via hole 155 in resin layer 153 (refer to FIG. 5). In a plan view, annular inclined surface 157 longer in one direction is formed between upper opening 155A and lower opening 155B. As indicated by dashed lines in FIG. 8, wiring 151 in a lower layer is in a state where an upper surface is exposed from lower opening 155B of via hole 155.

Figure 6:
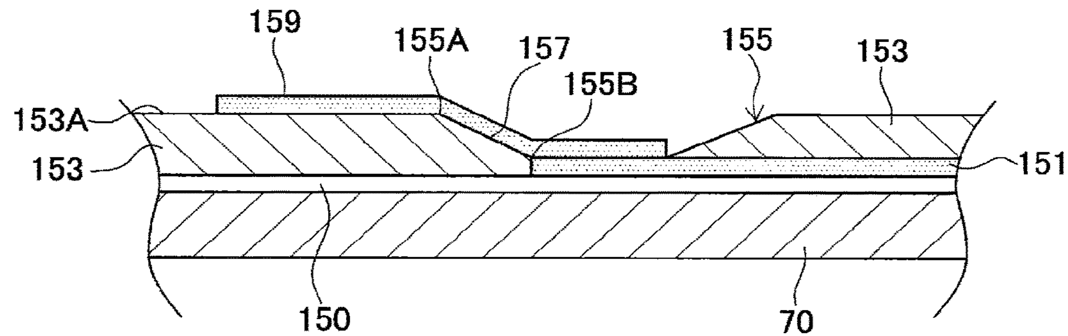
FIG. 6 is a schematic diagram for describing a step of forming wiring.

When resin layer 153 is formed, controller 120 fool's wiring 159 in an upper layer drawn out to upper surface 153A of resin layer 153 on a part of inclined surface 157 of via hole 155, as illustrated in FIGS. 6 and 8. Controller 120 forms multiple wirings 159 connected to each of multiple wirings 151. Specifically, controller 120 causes first printing section 72 to linearly discharge the conductive ink to the bottom portion of via hole 155 or inclined surface 157 by ink jet head 76. Controller 120 discharges the conductive ink in accordance with the position of each wiring 151 exposed from lower opening 155B of via hole 155. The conductive ink is discharged from an upper portion of wiring 151 exposed from lower opening 155B to upper surface 153A of resin layer 153 through (up) inclined surface 157.

Controller 120 may remove excess resin on wiring 151 before forming wiring 159 in an upper layer. In the shaping of resin layer 153, an excess ultraviolet curable resin may adhere to wiring 151 exposed from lower opening 155B. Therefore, for example, controller 120 may irradiate toward wiring 151 exposed from lower opening 155B of via hole 155 with a laser or the like to remove excess resin residue on wiring 151. As a result, the resistance at a connecting portion between wiring 151 and wiring 159 can be reduced.

Controller 120 controls firing section 74 to cause heat from the infrared heater of irradiation device 78 to be applied to the conductive ink discharged from the upper portion of wiring 151 to upper surface 153A of resin layer 153. As a result, the conductive ink can be fired to form multiple wirings 159 electrically connected to each wiring 151 in a lower layer. A wiring pattern in a lower layer and a wiring pattern in an upper layer can be electrically connected to each other. An angle of inclined surface 157 of via hole 155 is, for example, 25 degrees or less. The length of inclined surface 157 along the direction parallel to base material 70 is, for example, several hundred μm. In addition, the thickness of resin layer 153 is, for example, 20 to 40 μm.

As illustrated in FIG. 8, controller 120 forms, for example, a combination of wirings 151 and 159 side by side with predetermined pitch P1 therebetween. A set of wirings 151 and 159 are formed on a straight line along, for example, one direction (up-down direction in FIG. 8). That is, wiring 159 in an upper layer connected to wiring 151 is formed along a direction where wiring 151 in a lower layer is drawn out from via hole 155. On inclined surface 157 of via hole 155, multiple wirings 159 are arranged side by side along the longitudinal direction of via hole 155 (left-right direction in FIG. 8).

Here, in a case where the conductive ink is discharged onto inclined surface 157 of via hole 155, when the angle of inclined surface 157 is steep, the discharged conductive ink may flow down along inclined surface 157. As a result, the thickness of wiring 159 may be uneven or disconnection may occur. On the other hand, as the angle of inclined surface 157 is reduced, upper opening 155A of via hole 155 is widened, an occupied area of via hole 155 in resin layer 153 is increased, and the wiring density is reduced.

Figure 9:
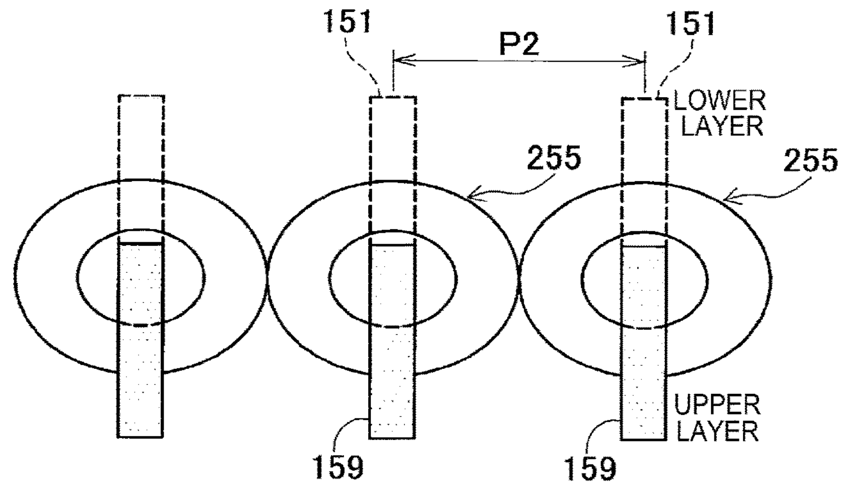
FIG. 9 is a plan view of a via hole in a comparative example.

FIG. 9 illustrates a state where via hole 255 in the comparative example is viewed in a plan view. FIG. 9 illustrates a case where one set of wirings 151 and 159 are formed in one via hole 255. As illustrated in FIG. 9, when only one set of wirings 151 and 159 is formed in one via hole 255, pitch P2 between wirings 151 increases according to the shape of via hole 255 or the size of the opening. Pitch P2 may be, for example, several millimeters. In addition, for example, it is possible to change the design of via hole 255 into an elliptical shape or the like (elliptical shape long in the up-down direction in FIG. 9) in accordance with the directions (arrangement directions) of wirings 151 and 159 along the up-down direction in FIG. 9. That is, it is possible to change the shape of via hole 255 to change the size of the opening in accordance with the direction where wirings 151 and 159 of each set are disposed (direction drawn out from via hole 255). However, matching the design of via hole 255 in the arrangement direction of wirings 151 and 159 may cause a delay in manufacturing time or an increase in manufacturing cost.

On the other hand, as illustrated in FIG. 8, in electronic device manufacturing apparatus 10 of the present embodiment, multiple sets of wirings 151 and 159 are shaped in one via hole 155. As a result, pitch P1 between wirings 151 can be significantly narrowed. Pitch P1 can be narrowed, for example, to several hundred μm or less depending on the accuracy of the three-dimensional additive manufacturing (such as resolution of the ink jet method). As a result, the wiring density of wirings 151 and 159 can be significantly increased.

In a conventional electroless plating method or the like used for manufacturing the via hole or the through-hole in board manufacturing, it is common to plate the entire inner wall of the via hole, and it is difficult to form the wiring on a part of inclined surface 157 (inner wall) as illustrated in FIG. 8. On the other hand, in electronic device manufacturing apparatus 10 of the present embodiment, wiring 159 can be formed at any position on inclined surface 157 by using the three-dimensional additive manufacturing. In other words, electronic device manufacturing apparatus 10 of the present embodiment can form multiple sets of wirings 151 and 159 in one via hole 155 by utilizing the advantages of the three-dimensional additive manufacturing, and the wiring density can be increased.

As illustrated in FIG. 8, controller 120 forms, for example, via hole 155 as a hole (slit shape) having a hole diameter long in one direction (left-right direction in FIG. 8). Via hole 155 includes upper opening 155A and lower opening 155B having rectangular shapes long in one direction in a plan view. Controller 120 forms multiple sets of wirings 151 and 159 arranged in the longitudinal direction of via hole 155. Therefore, a hole long in one direction is formed as via hole 155 corresponding to multiple sets of wirings 151 and 159 to be wiring patterns to be formed adjacent to each other. By arranging each set of wirings 151 and 159 side by side on inclined surface 157 of via hole 155, the wiring density can be increased.

Figure 10:
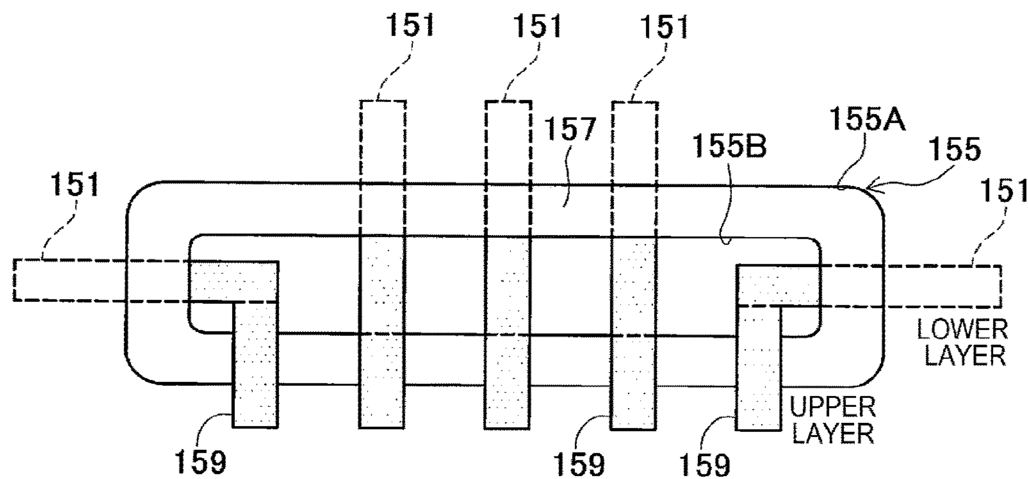
FIG. 10 is a plan view of a via hole of another example.

The shapes, positions, and the like of wirings 151 and 159 and via hole 155 illustrated in FIGS. 4 to 8 are examples. For example, as illustrated in FIG. 10, the direction where wiring 151 in a lower layer is drawn out from via hole 155 may be different from the direction where wiring 159 in an upper layer is drawn out from via hole 155. In addition, multiple wirings 151 or multiple wirings 159 may be disposed in directions that are not parallel to each other (different directions). As illustrated in FIG. 10, a pair of outermost wirings 151 may be disposed so as to extend outward, respectively. In this manner, by changing the arrangement direction of wirings 151 and 159 drawn out from one via hole 155, a degree of freedom of wiring pattern can be enhanced.

Figure 11:
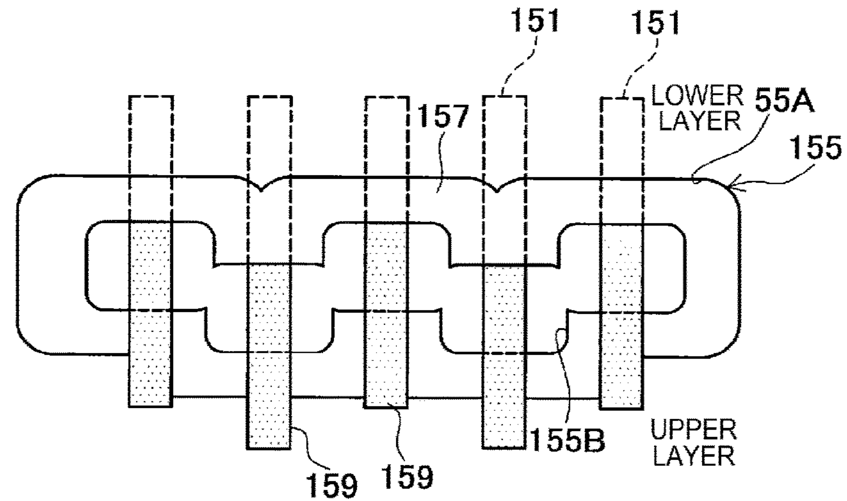
FIG. 11 is a plan view of a via hole of another example.

Via hole 155 is not limited to a long shape along one direction. As illustrated in FIG. 11, for example, multiple via holes having deviated positions may be coupled to each other to form one via hole 155. For example, in a case where it is set in control program 126 as design data to form one via hole in accordance with the connection positions of one set of wirings 151 and 159, controller 120 may determine whether each via hole is adjacent to a predetermined distance or less. Controller 120 may cause multiple via holes to be coupled to each other in response to being adjacent to each other by a predetermined distance or less. For example, when multiple via holes displaced in the up-down direction in FIG. 11 are coupled to each other, inclined surface 157 of via hole 155 has a shape protruding or recessed vertically in a plan view. As a result, wirings 151 and 159 that are adjacent to each other by an area where multiple via holes are overlapped can be made close to each other, and the wiring density can be increased.

Figure 7:
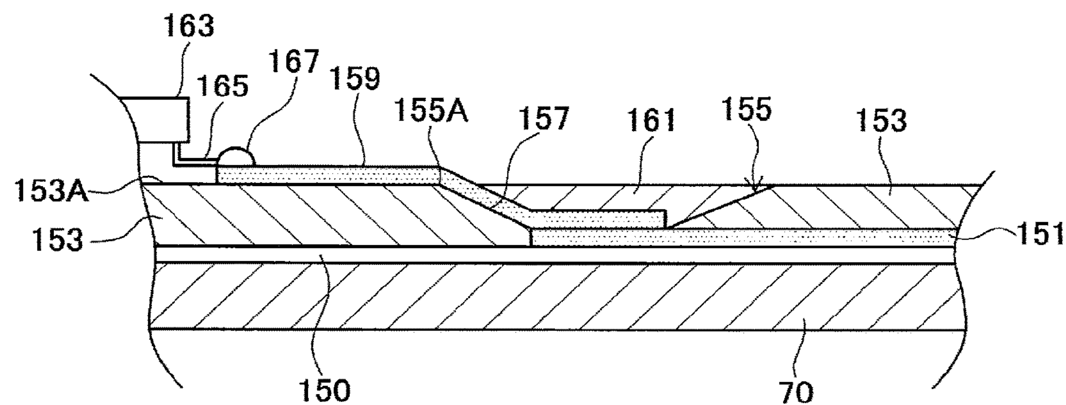
FIG. 7 is a schematic diagram for describing a step of forming wiring.
Figure 8:
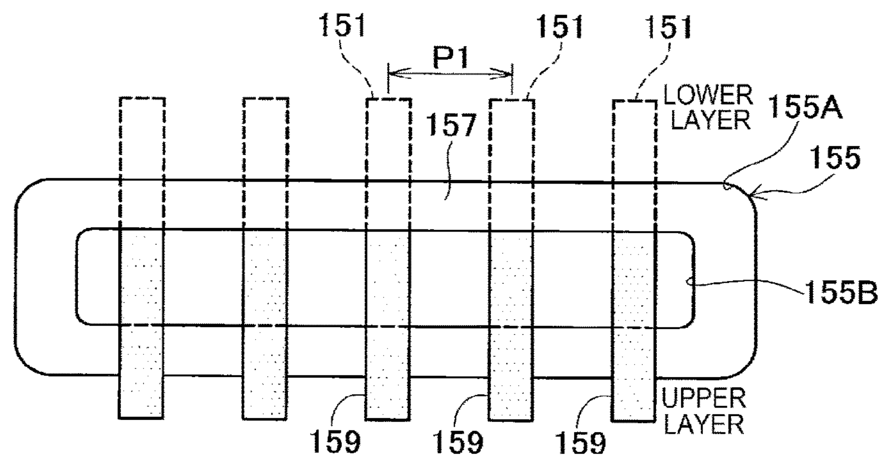
FIG. 8 is a plan view of a via hole.

Returning to FIG. 6, after forming multiple wirings 159, controller 120 fills via hole 155 with resin layer 161, for example, as illustrated in FIG. 7. Controller 120 causes first shaping unit 22 to form resin layer 161 by discharging the ultraviolet curable resin into via hole 155. In addition, controller 120 mounts the electronic component on wiring 159 on upper surface 153A of resin layer 153. Specifically, for example, after forming resin layer 161, controller 120 causes stage 52 to move to a position below third shaping unit 29. Controller 120 causes third shaping unit 29 to discharge the conductive paste to wiring 159 on upper surface 153A by dispenser 130.

After discharging the conductive paste, controller 120 causes stage 52 to move to a position below mounting unit 26, and causes electronic component 163 to be mounted by mounting section 102. Mounting head 112 of mounting section 102 is disposed so that component terminal 165 of electronic component 163 is located at the position of the conductive paste. Controller 120 heats and cures the conductive paste on wiring 159 by firing section 74 of first shaping unit 22 to form bump 167. Component terminal 165 of electronic component 163 is electrically connected to wiring 159 through bump 167.

Controller 120 may form multiple layers instead of forming only one layer of wirings 151 and 159 or resin layer 153. For example, controller 120 may further laminate resin layer 161 having via hole 155 on upper surface 153A or resin layer 161, and may form the wiring in an upper layer to be connected to wiring 159 on upper surface 153A. That is, the laminated board may be shaped while appropriately connecting any of multiple sets of wirings 151 and 159 drawn out from one via hole 155. In addition, the mounting method of electronic component 163 is not limited to the surface mounting illustrated in FIG. 7, and resin layer 153 may be formed on electronic component 163 to bury electronic component 163.

Figure 12:
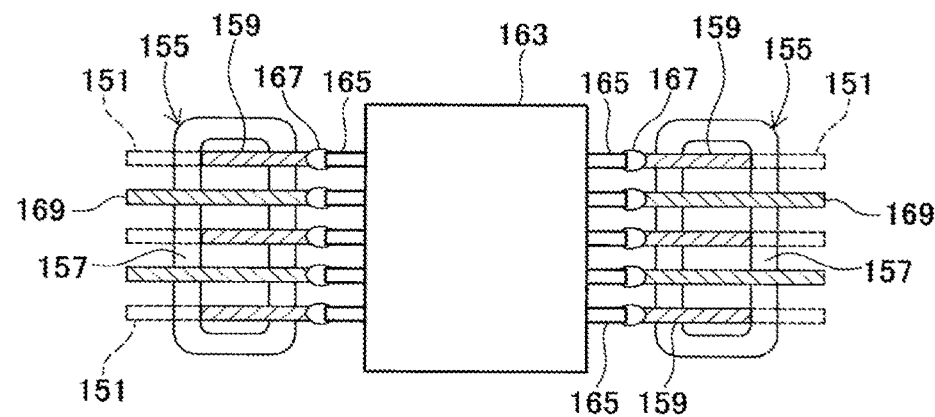
FIG. 12 is a plan view illustrating a state where an electronic component is mounted.

FIG. 12 is a plan view of a state where electronic component 163 is mounted on upper surface 153A of resin layer 153. In FIG. 12, resin layer 153 is not illustrated. For example, electronic component 163 is provided with multiple component terminals 165 at predetermined intervals along the up-down direction in FIG. 12. The up-down direction in FIG. 12 is an example of the direction where component terminals 165 of the present disclosure are arranged. Via hole 155 is formed by a hole long in the direction where component terminals 165 are arranged. Each wiring 159 drawn out from via hole 155 is connected to component terminal 165 through inclined surface 157, that is, connected to electronic component 163.

As illustrated in FIG. 12, multiple component terminals 165 provided on electronic component 163 such as IC chip may be arranged side by side in one direction. Long via holes 155 are formed in accordance with the arrangement of such component terminals 165, and multiple wirings 159 drawn out through via holes 155 are formed. Each of multiple wirings 159 is connected to each of multiple component terminals 165. As a result, multiple wirings 159 connected to electronic component 163 can be formed with high density by three-dimensional additive manufacturing.

Figure 13:
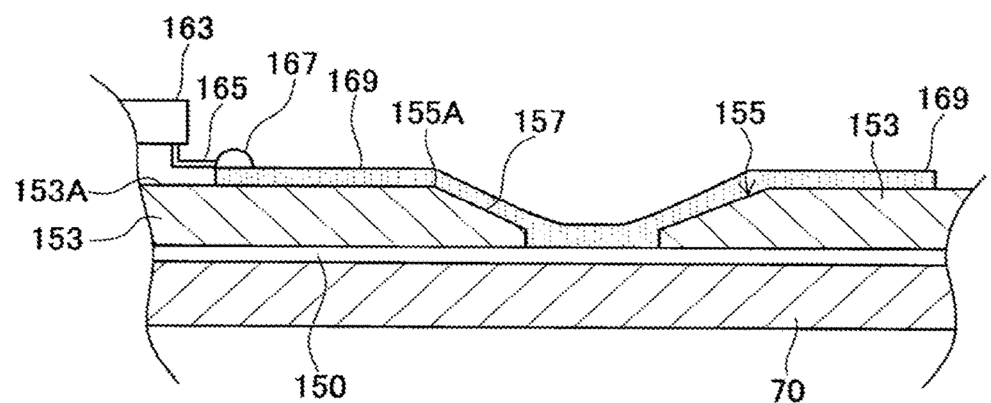
FIG. 13 is a cross-sectional view of folded wiring.

The wiring to be connected to electronic component 163 is not limited to wiring 159 to be connected to wiring 151 in a lower layer. For example, as illustrated in FIGS. 12 and 13, folded wiring 169 may be formed in via hole 155. For example, controller 120 forms folded wiring 169 with the conductive paste in a step of manufacturing wiring 159 (example of the connection wiring forming step of the present disclosure). For example, folded wiring 169 is wiring that passes through the bottom portion of via hole 155 after dropping down from upper surface 153A of resin layer 153 through inclined surface 157, and returns to upper surface 153A at another position of resin layer 153 through inclined surface 157.

Depending on the wiring pattern, the wiring passing through in the vicinity of wiring 159 or via hole 155 does not lower on the lower layer on which wiring 151 is formed, but the wiring to be disposed on upper surface 153A of resin layer 153 is generated. On the other hand, when the wiring is formed on a hole filled after a part of via hole 155 is filled or after all via hole 155 is filled only for disposing wiring not to be lower on the lower layer, the number of manufacturing steps increases, resulting in a delay in manufacturing time and an increase in manufacturing cost. On the other hand, in electronic device manufacturing apparatus 10 of the present embodiment, in a manufacturing step of wiring 159, the wiring to be disposed on upper surface 153A of resin layer 153 is formed as folded wiring 169 while forming wiring 159. Folded wiring 169 is formed using the same conductive ink as that of wiring 159. As a result, by forming two types of wirings in one step, it is possible to shorten the manufacturing time and reduce the manufacturing cost.

As illustrated in FIG. 12, electronic device manufacturing apparatus 10 may form multiple via holes 155 and wirings 151 and 159 in accordance with the positions of component terminals 165 of electronic component 163, and for example, a groove surrounding electronic component 163 may be formed as via hole 155. In addition, in electronic device manufacturing apparatus 10, as illustrated in FIG. 8, only wirings 151 and 159 not having folded wiring 169 may be formed in via hole 155 and connected to electronic component 163. In addition, for example, in a case where electronic component 163 is mounted on the surface of the board, via hole 155 needs not to be filled with resin layer 161 (FIG. 7), as illustrated in FIG. 13. As a result, it is possible to shorten the manufacturing time and reduce the manufacturing cost.

As described above, in electronic device manufacturing apparatus 10 of the present embodiment, in a step of forming resin layer 153, via hole 155 that penetrates resin layer 153 and has inclined surface 157 on the inner wall is formed in resin layer 153. In a case where via hole 155 is formed for each wiring 159, an area for forming via hole 155 is required to be secured in resin layer 153 (refer to FIG. 9). Upper opening 155A of via hole 155 widens as the inclination angle of inclined surface 157 decreases. As a result, pitch P1 between wirings 151 and 159 drawn out from two adjacent via holes 155 is widened. On the other hand, according to a method of forming wirings 151 and 159 described above, it is unnecessary to form via hole 155 for each wiring 159, and multiple wirings 151 and 159 can be formed in one via hole 155. As a result, pitch P1 between adjacent wirings 151 and 159 can be significantly narrowed. In addition, it is possible to provide a new wiring pattern not conventionally available for drawing out multiple wirings 151 and 159 from one via hole 155.

Figure 14:
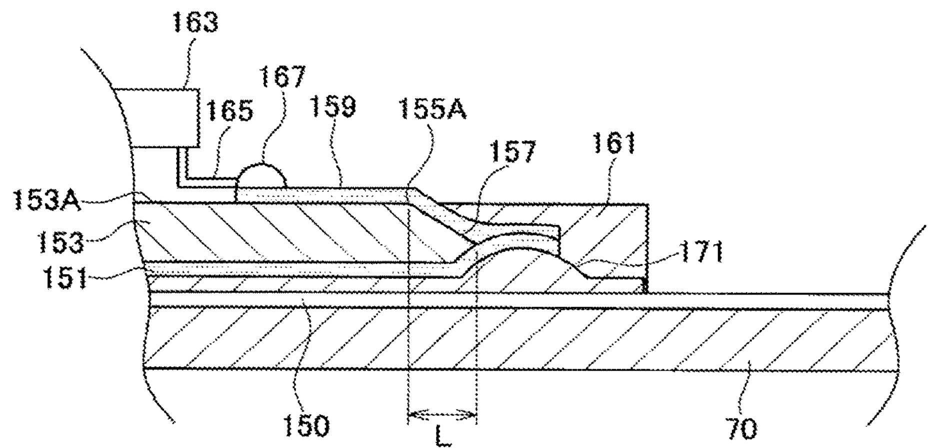
FIG. 14 is a cross-sectional view of another example of an inclined surface.

Inclined surface 157 on which multiple wirings 159 are disposed is not limited to the inner wall of via hole 155. For example, as illustrated in FIG. 14, inclined surface 157 may be formed on an end portion of resin layer 153. Inclined surface 157 in FIG. 14 is not an inner wall of via hole 155 as illustrated in FIG. 7, but is an end surface formed at the end portion of resin layer 153. Controller 120 forms, for example, wiring 151 in a lower layer, and forms wiring 159 along inclined surface 157 so as to fold wiring 151. After wiring 159 is formed, controller 120 fills the end portion of resin layer 153 with, for example, resin layer 161.

As illustrated in FIG. 14, pedestal member 171 may be formed to raise wiring 151 in a lower layer in accordance with the position of inclined surface 157. For example, controller 120 form is pedestal member 171 in accordance with the position of inclined surface 157 (in the case of via hole 155 in FIG. 6, position of lower opening 155B) before forming wiring 151. Pedestal member 171 is formed by, for example, an ultraviolet curable resin, and has a protruding shape at a lower portion of inclined surface 157. Controller 120 forms wiring 151 in a lower layer so as to extend along the surface of pedestal member 171. As a result, at a position where wiring 151 is connected to wiring 159, wiring 151 in a lower layer can be lifted by pedestal member 171 (moved closer to wiring 159). As a result, length L of inclined surface 157 in the direction along the plane of base material 70 can be shortened. In other words, upper opening 155A of inclined surface 157 (in the case of FIG. 7, via hole 155) can be reduced.

(Formation of External Electrode)

Figure 15:
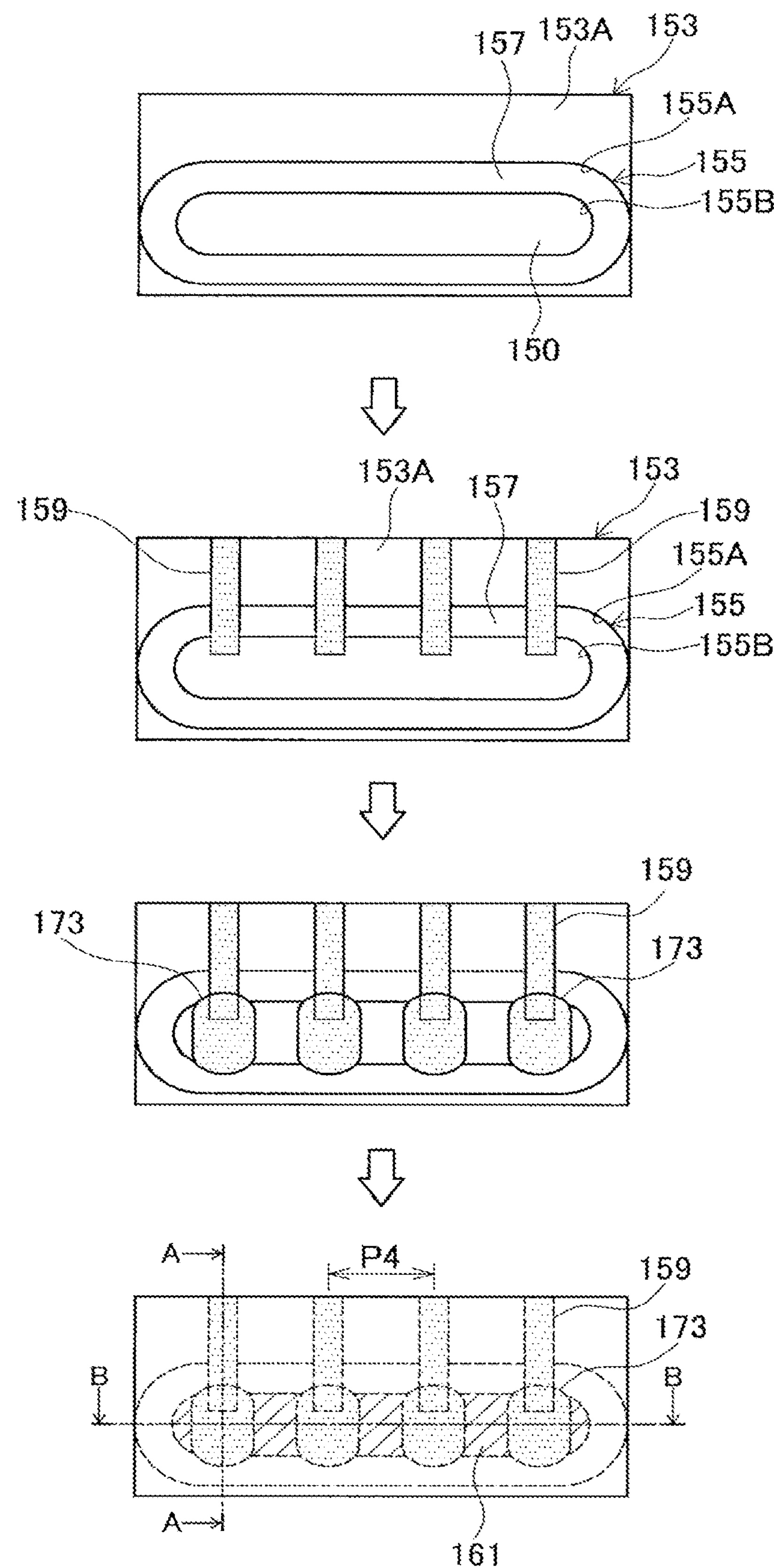
FIG. 15 is a schematic view for describing a step of forming an external electrode.
Figure 16:
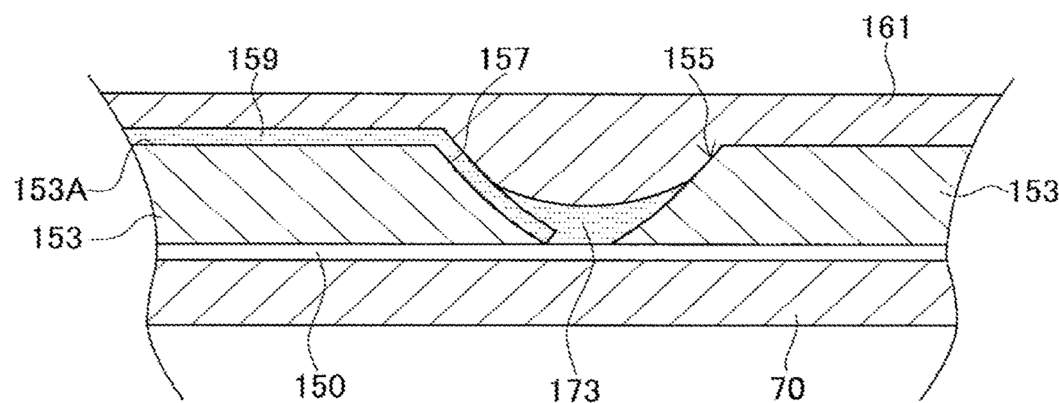
FIG. 16 is a cross-sectional view taken along the line A-A in FIG. 15.
Figure 17:
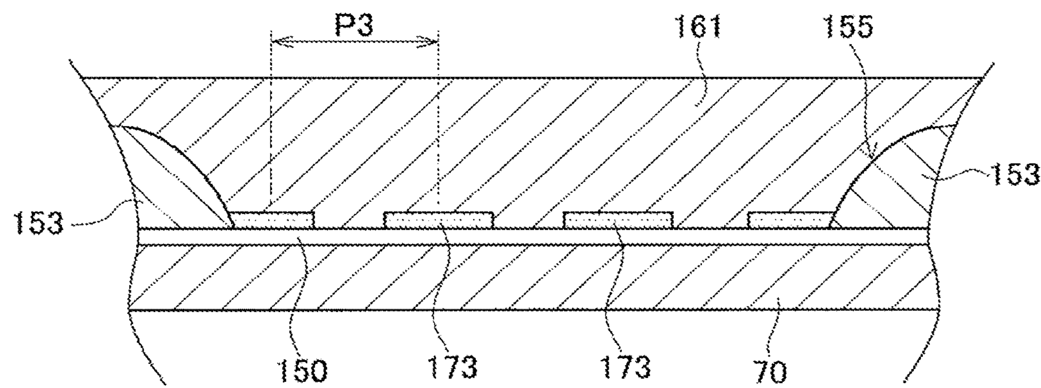
FIG. 17 is a cross-sectional view taken along the line B-B in FIG. 15.

In the above description, the case where wiring 151 is formed as the metal member of the present disclosure is described, but the metal member is not limited to wiring 151. For example, an external electrode connected to an external electronic device or the like may be formed as the metal member. FIG. 15 schematically illustrates a step of forming external electrode 173, and illustrates a state where via hole 155 is viewed in a plan view. FIG. 16 is a cross-sectional view taken along the line A-A in FIG. 15. FIG. 17 is a cross-sectional view taken along the line B-B in FIG. 15. In the following description, the description of the same contents as those of the forming steps of wirings 151 and 159 illustrated in FIGS. 4 to 7 described above will be omitted as appropriate.

In a case where external electrode 173 is formed, controller 120 first forms resin layer 153 having via hole 155 on, for example, release film 150 (uppermost drawing in FIG. 15). Via hole 155 is formed, for example, as an oval hole long in the left-right direction in FIG. 15.

Next, controller 120 forms wiring 159 in an upper layer (refer to second drawing from the top in FIG. 15) in accordance with the positions of multiple external electrodes 173 described later (refer to third drawing from the top in FIG. 15). Unlike the case where above-described wiring 151 is formed, for example, controller 120 first forms wiring 159 in an upper layer, and then forms external electrode 173 in a lower layer to be connected to wiring 159. Controller 120 forms multiple wirings 159 along inclined surface 157 in accordance with the positions of multiple external electrodes 173. For example, controller 120 forms multiple wirings 159 at predetermined pitch P4 (refer to lower most drawing in FIG. 15) along the longitudinal direction of via hole 155. Each wiring 159 is drawn out from the bottom portion of via hole 155 to upper surface 153A of resin layer 153 through inclined surface 157 (refer to FIG. 16).

Next, after forming wiring 159, controller 120 causes third shaping unit 29 to discharge the conductive paste to the bottom portion of via hole 155 (into lower opening 155B) from dispenser 130. Controller 120 causes dispenser 130 to discharge the conductive paste at predetermined pitch P3 (refer to FIG. 17) along the longitudinal direction of via hole 155. Controller 120 causes dispenser 130 to discharge the conductive paste so as to fill a part of wiring 159 in via hole 155. Controller 120 heats and cures the discharged conductive paste by firing section 74 to form multiple external electrodes 173 on the bottom portion of via hole 155 (third drawing from the top in FIG. 15). Each external electrode 173 is electrically connected to each wiring 159. In a case where the board (resin layer 153) is released from release film 150, multiple external electrodes 173 serve as electrodes exposed from the rear surface of the board.

Controller 120 fills via hole 155 with resin layer 161 as illustrated in the lowermost drawing of FIG. 15 and FIGS. 16 and 17. In a case where external electrode 173 is formed in addition to wiring 151 as the metal member in a lower layer in this manner, pitch P4 of wiring 159 in an upper layer drawn out from via hole 155 (refer to FIG. 15) and pitch P3 of external electrode 173 (refer to FIG. 17) can be narrowed, so that the wiring density can be increased. In the forming steps of FIGS. 15 to 17, only external electrode 173 is formed in one via hole 155, but both wiring 151 and external electrode 173 described above may be formed in one via hole 155. That is, wiring 151 in a lower layer and external electrode 173 may be collectively disposed in one via hole 155, and wiring 159 may be drawn out from each of multiple wirings 151 and external electrode 173.

Accordingly, at least one metal member of multiple metal members of the present embodiment may be external electrode 173 exposed from the lower surface of resin layer 153. Therefore, external electrode 173 exposed from the lower surface of resin layer 153 can be formed on a lower side of one inclined surface 157. As multiple metal members, wiring 151 and external electrode 173 can be combined and formed to dispose at a high density, and the wiring density of wiring 151 or wiring 159 drawn out from external electrode 173 can be increased.

As described above, as a metallic fluid in the case where external electrode 173 is formed as the metal member, a conductive paste containing micro-sized metal microparticles may be used. In addition, as a metallic fluid in the case where wiring 151 is formed as the metal member and as a metallic fluid for forming wiring 159, a conductive ink containing nano-sized metal nanoparticles may be used. In the present embodiment, the type of fluid containing metal particles is selectively used in the formation of external electrode 173 and the formation of wirings 151 and 159. In the case where external electrode 173 is formed, by using a fluid containing metal microparticles, a layer having a certain thickness can be formed by micro-sized metal microparticles, so that mechanical properties such as the tensile strength of external electrode 173 after shaping can be improved. The same applies to bump 167 in FIG. 7. In addition, in the case where wirings 151 and 159 are formed, by using a fluid containing metal nanoparticles, nano-sized metal nanoparticles are contacted with each other, fused, or the like to be cured, so that low-resistance wiring can be formed. Accordingly, it is possible to manufacture an electronic circuit having improved electrical properties and mechanical properties by utilizing the characteristics of the fluid containing the metal particles by selectively using the fluid containing the metal particles.

In the forming step illustrated in FIG. 15 described above, wiring 159 in an upper layer is formed first, and then external electrode 173 connected to wiring 159 is formed, but the present disclosure is not limited thereto. External electrode 173 may be first formed in via hole 155, and then wiring 159 connected to external electrode 173 may be formed.

In the above examples, wiring 151 and external electrode 173 are examples of metal member. Wiring 159 is an example of connection wiring. The conductive ink and the conductive paste are examples of the first fluid and the second fluid. FIG. 4 and the third drawing from the top in FIG. 15 are examples of a metal member forming step. FIG. 5 and the first drawing in FIG. 15 are examples of a resin layer forming step. FIG. 6 and the second drawing from the top in FIG. 15 are examples of a connection wiring forming step.

Hereinbefore, according to the present embodiment described above, the following effects are obtained.

In the forming steps of wirings 151 and 159 of the present embodiment, as illustrated in FIG. 4, multiple wirings 151 are formed by the conductive ink. Next, as illustrated in FIG. 5, resin layer 153 having upper surface 153A and inclined surface 157 inclined downward from upper surface 153A is formed. Next, as illustrated in FIG. 6, multiple wirings 159 are formed on inclined surface 157 and upper surface 153A of resin layer 153 by the conductive ink. In addition, each of multiple wirings 159 is connected to each of multiple wirings 151 on a lower side of inclined surface 157.

Therefore, multiple wirings 151 and multiple wirings 159 are connected to each other through one inclined surface 157 formed on resin layer 153. As a result, even when the angle of inclined surface 157 is reduced in order to suppress the flow-down of the conductive ink and an occupied area of inclined surface 157 is increased, the wiring density can be increased by forming multiple sets of combinations of wirings 151 and 159 on one inclined surface 157. Pitch P1 between wirings 151 and 159 can be significantly narrowed, and the wiring density can be significantly increased as compared with the case where wiring 151 and wiring 159 are formed one by one on multiple inclined surfaces 157 (FIG. 9). As a result, it is possible to downsize a final shaped object such as a board. In particular, pitch P1 can be narrower by improving the accuracy in the three-dimensional additive manufacturing (such as the resolution of the droplets), and, for example, the wiring density can be increased to several hundred μm or less.

The present disclosure is not limited to the above-described examples, but can be performed in various forms in which various modifications and improvements are made based on the knowledge of those skilled in the art.

For example, in the above examples, the case where wirings 151 and 159 are formed in one layer is described, but wirings 151 and 159 in multiple layers may be connected to each other through via hole 155 so as to overlap multiple resin layers 153.

Wiring 151 and external electrode 173 may be mixed and formed for one via hole 155. In the wiring formation method of the present disclosure, only wiring 151 may be formed, or only external electrode 173 may be formed.

Resin layer 153 may be a board on which electronic component 163 is not mounted.

Wiring 159 drawn out from via hole 155 may be connected to a part of multiple component terminals 165 of electronic component 163, and only one wiring 159 may be drawn out and connected from one via hole 155 as illustrated in FIG. 9 and connected to the other component terminal 165.

In the above examples, the ultraviolet curable resin cured by irradiation of ultraviolet light is employed, but various curable resins such as a thermosetting resin cured by heat can be employed.

The type of fluid containing metal particles used for wirings 151 and 159, bump 167, and external electrode 173 is not particularly limited. For example, the conductive ink may be used for external electrode 173, and the conductive paste may be used for wirings 151 and 159.

The three-dimensional additive manufacturing method in the present disclosure is not limited to an ink jet method or a stereo lithography method (SL), and other methods such as, for example, a fused deposition molding (FDM) method can be employed.

REFERENCE SIGNS LIST

151: wiring (metal member), 153: resin layer, 153A: upper surface, 155: via hole, 157: inclined surface, 159: wiring (connection wiring), 163: electronic component, 165: component terminal, 169: folded wiring, 173: external electrode (metal member).

The invention claimed is:

1. A wiring formation method comprising:

forming multiple metal members with a first fluid containing metal particles on a base material;

forming a resin layer including an upper surface and an inclined surface inclined downward from the upper surface on the base material; and forming multiple connection wirings on the inclined surface and the upper surface of the resin layer with a second fluid containing metal particles, wherein the multiple connection wirings are formed such that the multiple connection wirings are each separately connected to only one of the multiple metal members near a lower side of the inclined surface, and wherein the inclined surface of the resin layer is a common inclined surface upon which all of the multiple connection wirings are formed.

2. The wiring formation method according to claim 1, wherein, in forming the resin layer, a via hole penetrating the resin layer and having the common inclined surface on an inner wall is formed in the resin layer.

3. The wiring formation method according to claim 2, wherein, in forming the multiple connection wirings, a folded wiring descending downward from the upper surface of the resin layer along the inclined surface, and then passing along a bottom portion of the via hole, and returning to the upper surface at another position of the resin layer along the inclined surface is formed by the second fluid.

4. The wiring formation method according to claim 2, wherein the via hole is formed as a hole having a first diameter in a first direction and a second diameter in a direction other than the first direction, the first diameter is longer than the second diameter, and the multiple metal members and the multiple connection wirings are arranged side by side in the first direction of the via hole.

5. The wiring formation method according to claim 4, wherein the resin layer is a board on which an electronic component is disposed on the upper surface, the electronic component includes multiple component terminals arranged in the first direction, the multiple connection wirings are individually connected to the multiple component terminals.

6. The wiring formation method according to claim 1, wherein at least one metal member of the multiple metal members is an external electrode exposed from a lower surface of the resin layer after release from the base material.

7. The wiring formation method according to claim 1, wherein a fluid containing micro-sized metal microparticles is used as the first fluid in a case where at least one metal member of the multiple metal members is an external electrode exposed from a lower surface of the resin layer after release from the base material, and a fluid containing nano-sized metal nanoparticles is used as the second fluid.

8. The wiring formation method according to claim 6, wherein a fluid containing micro-sized metal microparticles is used as the first fluid, and a fluid containing nano-sized metal nanoparticles is used as the second fluid.

9. The wiring formation method according to claim 4, wherein the first diameter is longer than the second diameter in a plan view of the via hole.

10. The wiring formation method according to claim 5, wherein the first diameter is longer than the second diameter in a plan view of the board.

11. The wiring formation method according to claim 1, wherein a fluid containing nano-sized metal nanoparticles is used as the first fluid in a case where at least one metal member of the multiple metal members forms a wiring pattern, and the fluid containing the nano-sized metal nanoparticles is used as the second fluid.

12. The wiring formation method according to claim 1, further comprising forming a release film on the base material.

* * * * *